United States Patent
Zhang et al.

(10) Patent No.: US 6,303,458 B1
(45) Date of Patent: Oct. 16, 2001

(54) ALIGNMENT MARK SCHEME FOR STI PROCESS TO SAVE ONE MASK STEP

(75) Inventors: Yunqiang Zhang; Gang Qian; Chock Hing Gan, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/166,732

(22) Filed: Oct. 5, 1998

(51) Int. Cl.$^7$ .................................................... H01L 21/76
(52) U.S. Cl. ............................................................. 438/401
(58) Field of Search ........................... 438/401, 400, 438/424, 427, 404, 734, 691, 700, 703, 975, FOR 227

(56) References Cited

U.S. PATENT DOCUMENTS

| | | | |
|---|---|---|---|
| 5,316,966 | 5/1994 | Van Der Plas et al. | 437/70 |
| 5,369,050 | 11/1994 | Kawai | 437/62 |
| 5,401,691 | 3/1995 | Caldwell | 437/228 |
| 5,578,519 | 11/1996 | Cho | 437/67 |
| 5,700,732 | 12/1997 | Jost et al. | 438/401 |
| 5,733,801 | * 3/1998 | Gojohbori | 438/401 |
| 5,786,260 | * 7/1998 | Jang et al. | 438/401 |
| 5,889,335 | * 3/1999 | Kuroi et al. | 438/401 |
| 5,893,744 | * 4/1999 | Wang et al. | 438/40 |
| 5,923,993 | * 7/1999 | Sahota | 438/427 |
| 5,930,644 | * 7/1999 | Tsai et al. | 438/424 |
| 5,943,590 | * 8/1999 | Wang et al. | 438/427 |
| 5,963,816 | * 10/1999 | Wang et al. | 438/401 |
| 6,043,133 | * 3/2000 | Jang et al. | 438/401 |
| 6,049,137 | * 4/2000 | Jang et al. | 257/797 |
| 6,060,787 | * 5/2000 | Zhao et al. | 438/401 |

\* cited by examiner

*Primary Examiner*—Savitri Mulpuri
(74) *Attorney, Agent, or Firm*—George O. Saile; Rosemary L. S. Pike; William J. Stoffel

(57) ABSTRACT

A method of fabrication an alignment mark in a semiconductor device. The method uses one mask to that has two functions (1) a reverse active areas mask to remove the oxide from over active areas in the device areas and (2) an alignment mark open mask that removes the oxide from over the alignment mark area. The mask improves chemical-mechanical polish performance in the cell areas by removing the oxide over the active areas. Another key feature of the invention is the spacing of the alignment mark trenches that ensures that the step distance between the top of the second insulating layer in the alignment mark trench and the top surface of the substrate is greater than 2000 Å. This insures that the alignment marks are readable.

3 Claims, 3 Drawing Sheets

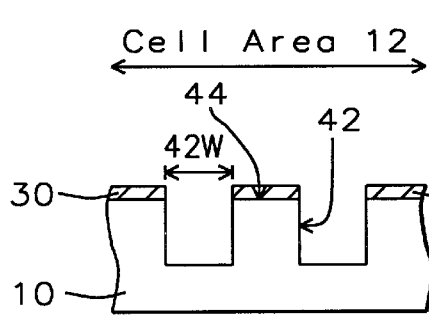
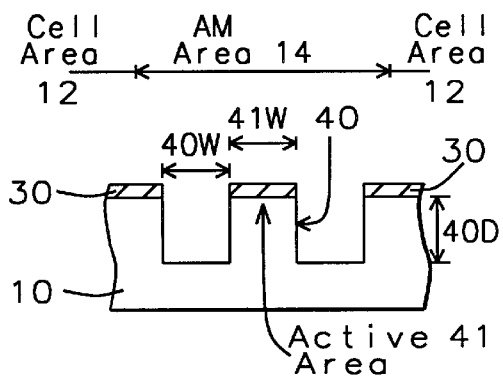
FIG. 1A
FIG. 1B
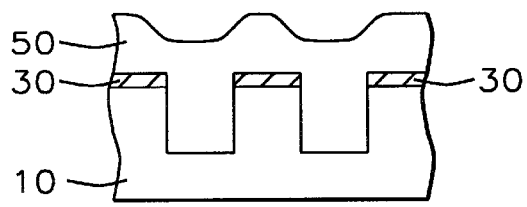
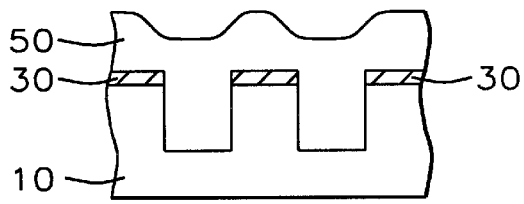
FIG. 2A
FIG. 2B
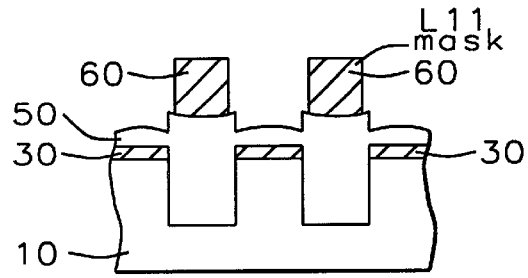
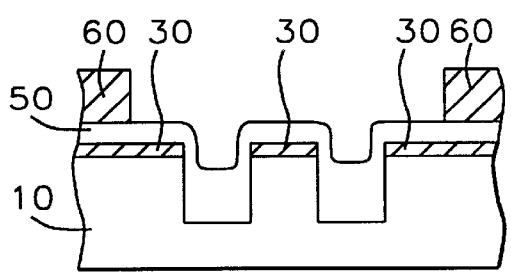
FIG. 3A
FIG. 3B
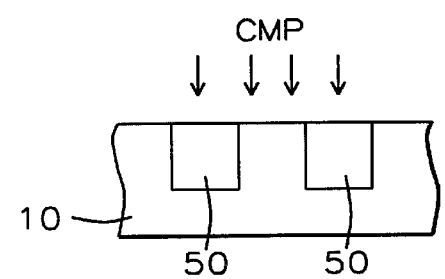
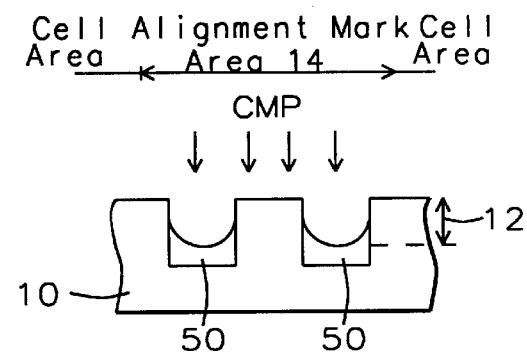
FIG. 4A
FIG. 4B

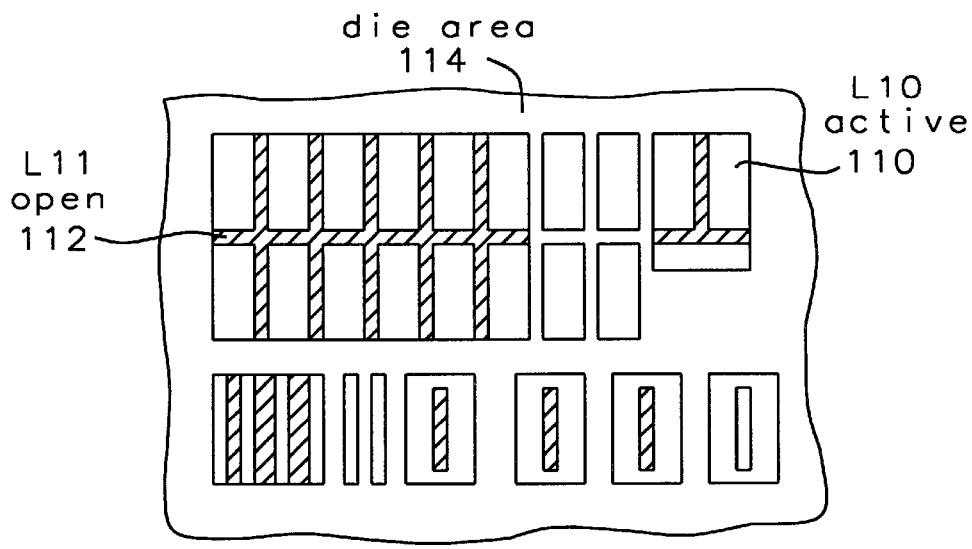
FIG. 6
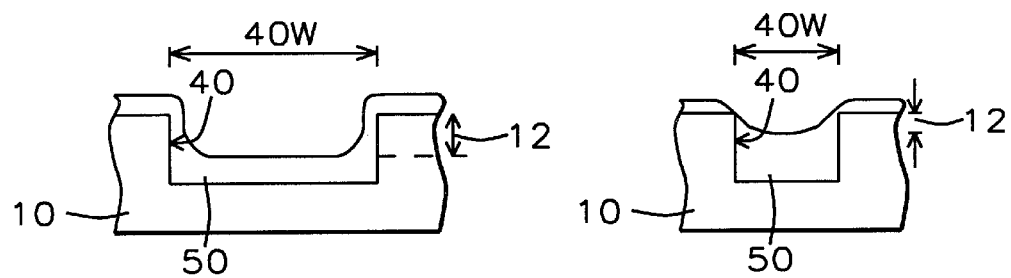
FIG. 7A   FIG. 7B
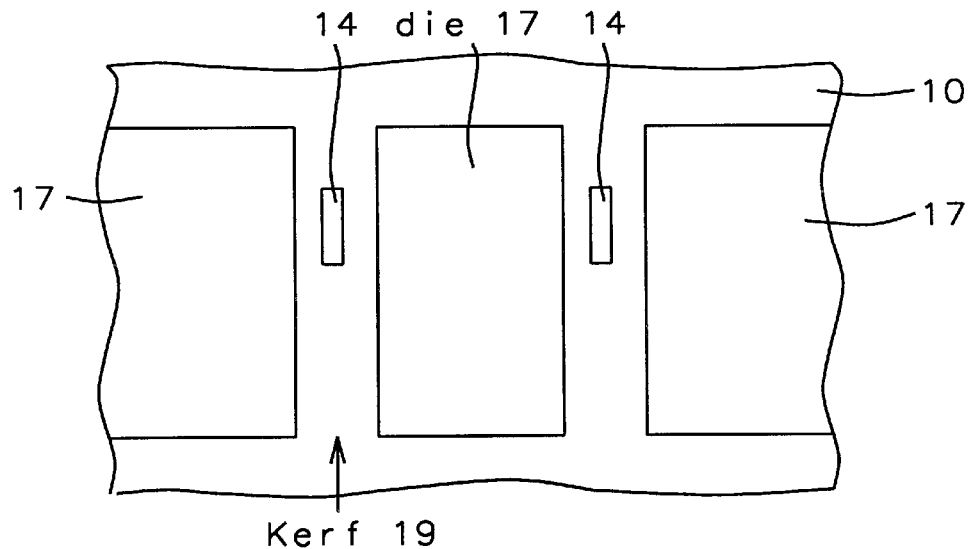
FIG. 8 – Prior Art

ALIGNMENT MARK SCHEME FOR STI PROCESS TO SAVE ONE MASK STEP

BACKGROUND OF INVENTION

1) Field of the Invention

This invention relates generally to the fabrication of alignment makes in a semiconductor device and, more particularly, to a method involving shallow trench isolation (STI) using a special mask to clear an insulating layer from over an alignment pattern in a semiconductor substrate and to clear the insulating layer from over Active areas in device areas.

2) Description of the Prior Art

As the level of integration in semiconductor devices has increased, device sizes have become smaller. Along with the trend, device isolation structures for electrical isolation between adjacent devices have also become smaller.

For STI structures, trenches are formed into a semiconductor substrate. Thereafter, the trenches are filled with an insulating material, like an oxide film, to a thickness sufficient to bury the trenches. Subsequently, the insulating materials etched back by a chemical mechanical polishing (CMP) method until the surface of an adjacent active region is exposed, thereby planarizing the whole surface of the semiconductor substrate having the trenches formed thereon. Thus, the device isolation structure is completed. The STI method is free of bird's beaks and has an advantage over the LOCOS structures with respect to minimization of isolation spacing. It possesses, however, a distinct drawback that an alignment pattern necessary for subsequent photolithography steps is not obtained, since not enough step is created on the surface of the semiconductor substrate in the STI structure. Conventionally, when a laser is projected from an aligner of a stepper and reflected on an alignment marks formed on the semiconductor substrate, an interference pattern formed due to the irregularities of the alignment mark pattern. The interference pattern is recognized in a detector, the direction and position of the semiconductor substrate are detected, and then the semiconductor substrate and equipment are adjusted in accordance with the detected direction and position of the semiconductor substrate, thereby performing alignment. However, in the STI, a device isolation oxide film is formed by etching back through using the chemical-mechanical polish method or the like, thus providing a planar semiconductor substrate without any step between the device formation area and the device isolation area.

When an opaque film like a tungsten silicide, used as a gate electrode material, is formed on such a planar surface, an interference pattern due to reflection will not be formed. The alignment of the photolithographic equipment, therefore, is practically difficult to perform.

FIG. 8 shows a top plan view of a preferred location of an alignment mark area 14 between prime dies 17 in a kerf 19 on a substrate 10.

A method for forming alignment mark patterns in a shallow trench isolation (STI) structure using a special mask and conventional technology will now be described in detail, referring to the attached drawings.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,700,732(Jost) shows a method of forming alignment marks in substrates using varying etch depths.

U.S. Pat. No. 5,401,691(Caldwell) shows a method of forming Alignment marks in layers using inverse frames.

U.S. Pat. No. 5,578,519(Cho) shows a method of forming an alignment mark using an STI process. U.S. Pat. No. 5,316,966(Van Der Plas et al. ) shows a method of forming alignment marks using STI processes.

U.S. Pat. No. 5,369,050(Kawai) shows another method of forming alignment marks in isolation areas.

SUMMARY OF THE INVENTION

It is an object of the present invention to provide a method for removing insulating layers from over alignment marks using a mask that reduces the number of masking steps.

It is an object of the present invention to provide a method for removing insulating layers from over alignment marks using a mask that also opens die area with some generation rule to improve CMP process.

It is an object of the present invention to provide a method using a novel mask for removing insulating layers from over alignment marks and for removing insulating layers from over active area (active area reverse mask) for chemical-mechanical polish processes.

It is an object of the invention to use provide a first mask 60 that combines (1) active reverse mask (that removes oxide from the active areas 44 in device areas 12) and (2) an alignment mark open mask (that removes oxide 50 from over the alignment mark areas 14).

To accomplish the above objectives, the present invention provides a method of fabrication an alignment mark in a semiconductor device. The method uses one mask 60 to that has two functions (1) a reverse active areas mask to remove the oxide from over active areas in the device areas 12 and (2) an alignment mark open mask 60 that removes the oxide from over the alignment mark area 14. The mask improves chemical-mechanical polish performance in the cell areas by removing the oxide over the active areas 44. Another key feature of the invention is the spacing of the alignment mark trenches 40 that ensure that the step distance 12 between the top of the second insulating layer in the alignment mark trench 40 and the top surface of the substrate 10 is greater than 2000 Å. This insures that the alignment mark are readable. The invention's spaces specifications are as follows: the alignment mark trenches have a width 40W greater than about 2 µm, and the active areas 41 in the alignment mark area 14 having a width 41W greater than 3 µm.

The method includes the following steps. We form a first insulating film pattern 30 for defining STI regions in a cell array area 12 and defining alignment mark trenches regions in an alignment mark area 14 on a semiconductor substrate 10. Next STI trenches 42 are formed in the STI regions and alignment mark trenches 30 are formed in the alignment mark area 14, using the first insulating film pattern 30 as a mask. The STI trenches 42 and alignment mark trenches 40 are formed defining active areas 44 41. The alignment mark trenches 40 have a width 40W greater than about 2 µm, and the active areas 41 in the alignment mark area 14 having a width greater than 3 µm.

Then, we form a second insulating film 40 on the whole surface of the semiconductor substrate, while filling the STI trenches 30 and the alignment mark trenches 40;

A important first mask (L11 mask) is formed covering the STI regions in the cell array area and having an opening over the alignment mark area 14.

We etch the second insulating film 40 formed on the active regions 44 41 of the cell array area and etch the second insulating film 40 formed on the alignment mark area, to a predetermined thickness.

Subsequently, we chemical-mechanical polish the second insulating layer to expose the first insulating film pattern leaving portions of the second insulating layer in the alignment mark trenches and STI trenches. A step distance 12 between the top of the second insulating layer in the alignment mark trench and the top surface of the substrate is greater than 2000 Å. Lastly, the first insulating film pattern is removed.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A, 2A, 3A and 4A are cross sectional views in a cell area 12 for illustrating a method for manufacturing an alignment mark according to the present invention.

FIGS. 1B, 2B, 3B and 4B are cross sectional views in a cell area 12 for illustrating a method for manufacturing an alignment mark according to the present invention.

FIG. 6 is top plan view of the designs of the STI trench mask (L10) and the first mask (L11) mask 60 that is used to expose and define the first photoresist mask according to the present invention.

FIGS. 7A and 7B are cross sectional view of alignment mark trenches according to the present invention. FIG. 7A shows a trench with a width greater than 2 μm and FIG. 7B shows an alignment mark trench with a width less than 2 μm.

FIG. 8 shows a top plan view of a location of an alignment mark area 14 between prime dies 17 in a kerf 19 on a substrate 10 according to the prior art.

DETAILED DESCRIPTION OF THE PREFERRED EMBODIMENTS

Figure 5A:
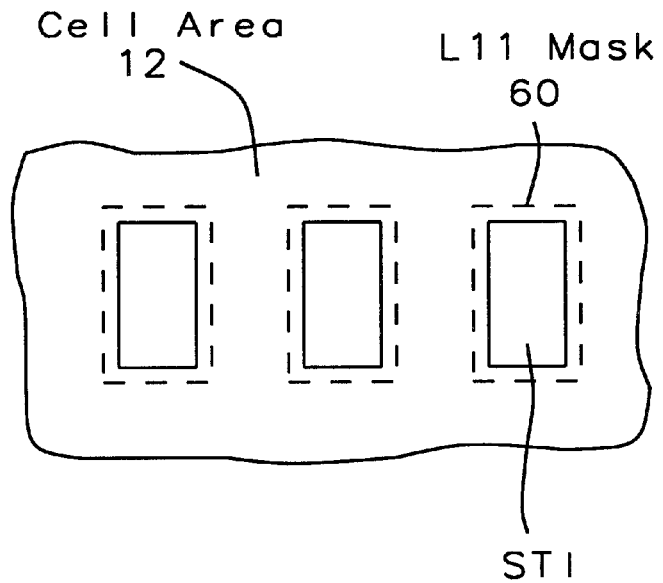
FIGS. 5A and 5B are top plan views for illustrating the alignment mark areas and first (L11) mask according to the present invention.

The present invention will be described in detail with reference to the accompanying drawings. In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

FIG. 1A shows the step of forming a first insulating film pattern 30 for defining STI regions in a cell array area 12 and defining alignment mark trenches regions in an alignment mark area 14 on a semiconductor substrate 10. The first insulating film pattern 30 can be formed of two layers: a top silicon nitride (SiN) layer and underlying pad oxide.

To pattern the first insulating film, a STI trench resist mask (not shown) (L10 mask) (Active area mask) is formed thereover. Opening are etched in the first insulating film to form the first insulating film pattern 30 shown in FIGS. 1A and 1B. The opening define the shallow trench isolation (STI) trenches 42 in the cell area 12 and the alignment mark trenches 40 in the alignment mark area 14.

FIG. 1A also shows forming STI trenches 42 in the STI regions and forming alignment mark trenches 40 in the alignment mark area 14, using the first insulating film pattern 30 as a mask. The STI trenches 42 and alignment mark trenches 40 define the active areas 44 41. A shallow trench isolation (STI) trench photoresist mask (not shown) (e.g., L10 mask) is used to define and etch the first insulating film pattern.

The alignment mark trenches 40 preferably have a width 40W in a range of between about 2 and 5 μm (must be >2 μm) and a depth 40D in a range of between about 1000 Å and 5000 Å (Tgt greater than 1000 Å). Nikon steppers usually require 4 μm spacing 41W between alignment mark trenches, however with the invention's process, a >2 μm spacing 41W is all that is required.

The active areas 41 between the alignment mark trenches 40 preferably have a width in a range of between about 3 and 5 μm (tgt greater than =3 μm ).

Next, as shown in FIGS. 2A and 2B a second insulating film 40 is formed on the whole surface of the semiconductor substrate, to fill the STI trenches 30 and the alignment mark trenches 40. The second insulating film 40 is preferably formed of oxide having a thickness in a range of between about 5000 and 10,000 Å.

Figure 5B:
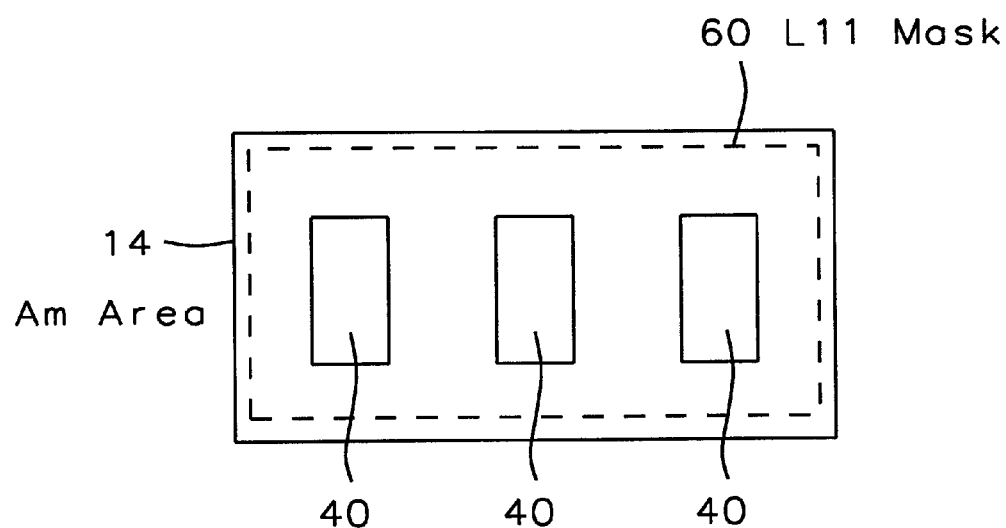

In an important step, as shown in FIGS. 3A and 3B, a first mask (L11 mask) 60 is formed covering the STI regions in the cell array area, active areas openings over the active areas in the cell array area, and having an opening over the alignment mark area 14. See FIGS. 5A and 5B . It is important to note that the first mask 60 has resist covering the STI regions in the product areas but has a opening over the entire alignment mark area. See FIG. 5B. FIGS. 5A and 5B are a top plan views for illustrating the alignment mark areas and L11 mask 60. The first mask has two functions: (1) a reverse active areas mask (reverse of the active areas mask—see FIG. 1A) to remove the oxide 50 from over active areas 44 in the device areas 12 and (2) an alignment mark open mask 60 that removes the oxide 50 from over the whole alignment mark area 14.

Next, using the first mask 60 as an etch mask, the second insulating film 40 formed on the active regions 44 41 of the cell array area is etched back and the second insulating film 40 formed on the alignment mark area is etched back, to a predetermined thickness.

FIGS. 4A and 4B shows the step of chemical-mechanical polishing the whole surface of the semiconductor substrate including the insulating layer 50.

FIG. 6 shows a top plan view of a comparison (overlaid) between the STI trench mask (L10) and the first (L11) photoresist mask 60. The first mask is generated from the shallow trench isolation (STI) mask (not shown) (mask used to define the STI trenches 42 and alignment mark trenches 40—See FIGS. 1A and 1B). The purpose of this mask is to improve the STI CMP process. The first mask has the following areas: die area 114, active area 110 and open areas 112.

FIG. 7A is a cross sectional view of the alignment mark trench 40 that has a width 40W greater than 2 μm and has a step 12 greater than 2 μm. The inventors have found that it is critical to have the alignment mark trench width 40W greater than 2 μm and the active area width 41W greater than 3 μm for the step 12 to be acceptable for the reader (step 12 is greater than 2 μm).

FIG. 7B shows an alignment mark trench 40 with a width 40W less than 2 μm and that has an unacceptable step 12 (less than 2 μm). The inventors have found a width 40W less than 2 μm results in steps 12 less than 2000 Å that the alignment mark reader cannot reliably read.

FIG. 8 shows a top plan view of a preferred location of an alignment mark area 14 between prime dies 17 in a kerf 19 on a substrate 10.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabrication an alignment mark in a semiconductor device, the method comprising the steps of:
   a) forming a first insulating film pattern for defining STI regions in a cell array area and defining alignment mark trenches regions in an alignment mark area on a semiconductor substrate; said first insulating film pattern is composed of a pad oxide layer and a silicon nitride layer;
   b) forming STI trenches in said STI regions and forming alignment mark trenches in said alignment mark area, using said first insulating film pattern as a mask; said STI trenches and alignment mark trenches defining active areas; said alignment mark trenches have a width greater than about 2 μm; said alignment mark trenches have a depth in a range of between about 1000 Å and 5000 Å; said active areas between said alignment mark trenches in said alignment mark area having a width in a range of between about 3 and 5 μm;
   c) forming a second insulating film on the whole surface of said semiconductor substrate, while filling said STI trenches and said alignment mark trenches;
   d) forming a first mask covering said STI regions in said cell array area, and having active areas openings over the active areas in the cell array area and having an opening over said alignment mark area;
   e) etching said second insulating film formed on said active regions of said cell array area and etching said second insulating film formed on said alignment mark area, to a predetermined thickness;
   f) chemical-mechanical polishing the said second insulating layer to expose said first insulating film pattern leaving portions of said second insulating layer in said alignment mark trenches and STI trenches; a step distance between the top of the second insulating layer in said alignment mark trench and the top surface of said substrate is greater than 2000 Å;
   g) removing said first insulating film pattern.

2. A method of fabrication an alignment mark in a semiconductor device, the method comprising the steps of:
   a) forming a first insulating film over a semiconductor substrate said first insulating film is composed of a pad oxide layer and a silicon nitride layer;
   b) forming a STI trench resist mask over said first insulating film;
   c) etching openings in said first insulating film to form the first insulating film pattern; said a first insulating film pattern for defining STI regions in a cell array area and defining alignment mark trenches regions in an alignment mark area on a semiconductor substrate;
   d) forming STI trenches in said STI regions and forming alignment mark trenches in said alignment mark area, using said first insulating film pattern as a mask; said STI trenches and alignment mark trenches defining active areas; said alignment mark trenches have a width greater than about 2 μm; said alignment mark trenches have a depth in a range of between about 1000 Å and 5000 Å; said active areas between said alignment mark trenches in said alignment mark area having a width in a range of between about 3 and 5 μm;
   e) forming a second insulating film on the whole surface of said semiconductor substrate, while filling said STI trenches and said alignment mark trenches;
   f) forming a first mask covering said STI regions in said cell array area, and having active areas openings over the active areas in the cell array area and having an opening over said alignment mark area;
   g) etching said second insulating film formed on said active regions of said cell array area and etching said second insulating film formed on said alignment mark area, to a predetermined thickness;
   h) chemical-mechanical polishing the said second insulating layer to expose said first insulating film pattern leaving portions of said second insulating layer in said alignment mark trenches and STI trenches; a step distance between the top of the second insulating layer in said alignment mark trench and the top surface of said substrate is greater than 2000 Å; and
   i) removing said first insulating film pattern.

3. The method of claim 2 wherein said alignment mark trenches have a width greater than about 2 μm and less than 10 μm.

* * * * *